(12) United States Patent
Henriksen et al.

(10) Patent No.: US 12,146,924 B2
(45) Date of Patent: Nov. 19, 2024

(54) METHOD FOR MONITORING AN ELECTRICAL POWER TRANSMISSION SYSTEM AND AN ASSOCIATED DEVICE

(71) Applicant: SUPERGRID INSTITUTE, Villeurbanne (FR)

(72) Inventors: Martin Molby Henriksen, Lyons (FR); Ludovic Stéphane Boyer, Saint Joseph (FR)

(73) Assignee: SUPERGRID INSTITUTE, Villeurbanne (FR)

( * ) Notice: Subject to any disclaimer, the term of this patent is extended or adjusted under 35 U.S.C. 154(b) by 112 days.

(21) Appl. No.: 17/924,470

(22) PCT Filed: May 11, 2021

(86) PCT No.: PCT/EP2021/062409
§ 371 (c)(1),
(2) Date: Nov. 10, 2022

(87) PCT Pub. No.: WO2021/228806
PCT Pub. Date: Nov. 18, 2021

(65) Prior Publication Data
US 2023/0341473 A1   Oct. 26, 2023

(30) Foreign Application Priority Data

May 14, 2020 (FR) .................................. 2004784

(51) Int. Cl.
*G01R 31/00* (2006.01)
*G01R 31/08* (2020.01)
(Continued)

(52) U.S. Cl.
CPC ............ *G01R 31/52* (2020.01); *G01R 31/003* (2013.01); *G01R 31/083* (2013.01); *G01R 31/58* (2020.01)

(58) Field of Classification Search
CPC .. G01R 31/003; G01R 31/081; G01R 31/083; G01R 31/52; G01R 31/58
See application file for complete search history.

(56) References Cited

U.S. PATENT DOCUMENTS 5,652,521 A * 7/1997 Meyer .................... G01R 15/16
324/541
7,353,123 B2 * 4/2008 Takakamo .......... G01R 19/2513
702/57

(Continued)

OTHER PUBLICATIONS

International Search Report issued on Aug. 12, 2021 in corresponding Application No. PCT/EP2021/062409; 5 pgs.

*Primary Examiner* — Thang X Le
(74) *Attorney, Agent, or Firm* — Maier & Maier, PLLC (57) ABSTRACT

A method for monitoring a system for transmitting electrical power for a network for transmitting DC electrical power. The method involves determining, along a measurement segment, a profile of a temperature parameter, determining a theoretical leakage current between the grounding connections of the measurement segment, taking into account the temperature parameter profiles and the load current and voltage, measuring the leakage current between the grounding connections of the measurement segment, and generating an alert if there is a difference between the theoretical and measured leakage current.

17 Claims, 5 Drawing Sheets

(51) Int. Cl.
  *G01R 31/52*   (2020.01)
  *G01R 31/58*   (2020.01)

(56) References Cited

U.S. PATENT DOCUMENTS

| | | | |
|---|---|---|---|
| 9,903,899 B2* | 2/2018 | Phillips | G01R 15/14 |
| 2003/0112015 A1* | 6/2003 | Takakamo | G01R 27/18 |
| | | | 324/525 |
| 2011/0218790 A1 | 9/2011 | Ajgaonkar et al. | |
| 2015/0309106 A1* | 10/2015 | Machida | G01R 27/18 |
| | | | 324/509 |
| 2020/0116776 A1 | 4/2020 | Ismail et al. | |
| 2021/0325442 A1* | 10/2021 | Brocard | G01R 31/1245 |
| 2021/0384716 A1* | 12/2021 | Rhysing | G06F 3/14 |

* cited by examiner

METHOD FOR MONITORING AN ELECTRICAL POWER TRANSMISSION SYSTEM AND AN ASSOCIATED DEVICE

FIELD

The field of the present invention relates to the transmission of electricity in direct current transmission networks, in particular High Voltage Direct Current (HVDC) networks, and more particularly to a method for monitoring such an electrical power transmission cable in order to detect a fault in the said electrical power transmission cable.

BACKGROUND

The current development of renewable energies is causing new constraints on the electricity grid because the various electricity-production sites are generally far from each other and from the consumption areas. It is therefore necessary to develop new transmission networks capable of transporting electricity over very long distances while minimising energy losses.

To meet these constraints, High Voltage Direct Current (HVDC) networks (e.g. 320 kV) appear to be a promising solution due to lower line losses than AC networks and to the absence of the impact of parasitic network capacities over long distances.

However, in such HVDC networks, especially in the case of multipoint or mufti-node networks, in the event of a short-circuit on one of the lines, the fault propagates very quickly throughout the system and the short-circuit current can reach several tens of kA in a few milliseconds and exceed the breaking capacity of HVDC circuit breakers, which is generally limited to about 15 kA.

It is therefore necessary to establish a strategy of prevention, and of reliable and rapid protection, making it possible to detect the appearance of a fault as early as possible, to locate it and to interrupt the faulty line locally in order to avoid any propagation to the rest of the network and also to avoid the de-energisation of a large part of the network. If the occurrence of a fault can be detected preventively, then maintenance actions can be planned in advance, such as the replacement of a part of the electrical transmission cable, and the distribution of electrical power during the maintenance intervention can be arranged in a planned manner without compromising the electrical power distribution of the network as a whole.

One aspect to be addressed for preventive maintenance in such electrical power transmission networks is the detection of a deterioration of the properties of the transmission cable, in particular a deterioration of the insulation sheath around the central conducting core.

It should be remembered that electrical transmission cables can be buried along their course and can be exposed to various environmental factors. For example, buried under a road in summer, the transport cable can be exposed to high temperatures. The cable can also pass through rivers, fields, lakes, the sea or forests, for example. It is therefore also understood that different cable sections are not all exposed to the same environmental parameters so that the alteration of the electrical power transmission cable is not uniform.

For example, a system for monitoring an electrical power transmission cable is known from WO2012162486. However, the proposed system does not seem to be precise enough, especially in order to be able to programme preventive maintenance actions, for example.

SUMMARY

It is an object of the present invention to provide a method and a device for monitoring an electrical power transmission system that can be more accurate in determining an alert.

To this end, the present invention relates to a method for monitoring an electrical power transmission system for a DC electrical power transmission network comprising an electrical power transmission cable, with:
- an electrically conductive central core configured to transmit an electrical current,
- an electrically insulating jacket around the central core,
- a metal shield around the insulating jacket,
- grounding connections of the metal shield, a measurement segment being defined between two successive grounding connections, the method comprising the following steps:
- determining, along a measurement segment, at least one profile of a temperature parameter,
- determining a theoretical leakage current between the grounding connections of the measurement segment, taking into account the temperature parameter profiles and the load current and voltage,
- measuring the leakage current between the grounding connections of the measuring segment,
- generating an alert if the difference between the theoretical leakage current and the measured leakage current exceeds a predetermined threshold.

The method can have one or more of the following aspects alone or in combination.

According to one aspect, for example, at least some temperature parameter profiles, in particular the external temperature of the electrical power transmission cable, are calculated by measurements with a fibre optic system.

According to another aspect, for example, at least certain temperature parameter profiles, in particular the aboveground ambient temperature, are determined by means of temperature sensor measurements along a measurement segment and/or by means of weather data along a measurement segment.

Determination of a theoretical leakage current includes the following steps:
- classifying the power transmission cable of a measuring segment into sections by several temperature ranges, wherein a temperature range spans 10° C. or less, in particular 5° C. or less,
- determine theoretical partial leakage currents per section by calculations,
- adding the partial theoretical leakage currents to obtain the theoretical leakage current of a measurement segment.

The span of the temperature range within one section is in particular less than 2° C., in particular 1.5° C.

The step of calculating a partial theoretical leakage current per section is carried out in particular in a single operation for sections of the same class after the classification.

A temperature parameter is the external temperature of the electrical power transmission cable or the temperature measured in the vicinity of the electrical power transmission cable or the ambient ground temperature along the power cable of a measurement segment.

When determining g a theoretical leakage current in a measurement segment by calculation, at least one environmental parameter from the following group is taken into account, for example:

the burial-depth profile of the electrical transmission cable, the thermal-resistance profile of the soil surrounding the electrical transmission cable, the specific-heat profile of the soil surrounding the electrical transmission cable.

When determining a theoretical leakage current of a measurement segment by calculation, an ageing model is taken into account, in particular the thermal and/or electrical properties of the insulating jacket of the power transmission cable.

The invention also relates to an electrical power transmission system monitoring device for a DC electrical power transmission network comprising an electrical power transmission cable, with:

an electrically conductive central core configured to transmit an electrical current, an electrically insulating jacket around the central core, a metal shield around the insulating jacket, grounding connections of the metal shield, a measurement segment being defined between two successive grounding connections, the device comprising one or more functional units configured to:

determine, along a measurement segment, at least one profile of a temperature parameter, determine a theoretical leakage current between the grounding connections of the measurement segment, taking into account the temperature parameter profiles and the load current and voltage, measure the leakage current between the grounding connections of the measuring segment, generate an alert if the difference between the theoretical leakage current and the measured leakage current exceeds a predetermined threshold.

The device can have one or more of the following aspects alone or in combination.

At least one functional unit is, for example, configured to determine at least some temperature parameter profiles, in particular the external temperature of the electrical power transmission cable, through measurements by a fibre optic system.

In particular, a functional unit is configured to determine at least some temperature parameter profiles, in particular the above-ground ambient temperature, by means of temperature sensor measurements and/or weather data.

At least one functional unit is for example configured to:

perform a classification by several temperature ranges of the power transmission cable of a measuring segment into sections, a temperature range having a span of 5° C. or less, determine theoretical partial leakage currents per section, add the partial theoretical leakage currents to obtain the theoretical leakage current of a measurement segment.

The span of the temperature range within one section is in particular less than 2° C., in particular 1.5° C.

A temperature parameter is in particular the external temperature of the electrical power transmission cable or the ambient ground temperature along the power cable of a measurement segment.

In particular, at least one functional unit is configured to take into account at least one environmental parameter from the following group when calculation of a theoretical leakage current in a measurement segment:

the burial-depth profile of the electrical transmission cable, the thermal-resistance profile of the soil surrounding the electrical transmission cable, the specific-heat profile of the soil surrounding the electrical transmission cable, For example, at least one functional unit is configured to take an ageing model into account, in particular the thermal and/or electrical properties of the insulating jacket of the power transmission cable when calculating a theoretical leakage current in a measurement segment.

BRIEF DESCRIPTION OF THE FIGURES

Further features and advantages of the invention will be apparent from the following description, which is given by way of example and without limitation, with reference to the annexed drawings in which.

In all figures, elements with identical functions have the same reference numbers.

DETAILED DESCRIPTION OF THE EMBODIMENTS

The following embodiments are examples. Although the description refers to one or more embodiments, this does not necessarily mean that each reference is to the same embodiment, or that the features apply only to one embodiment. Simple features of different embodiments may also be combined or interchanged to provide further embodiments.

Figure 1:
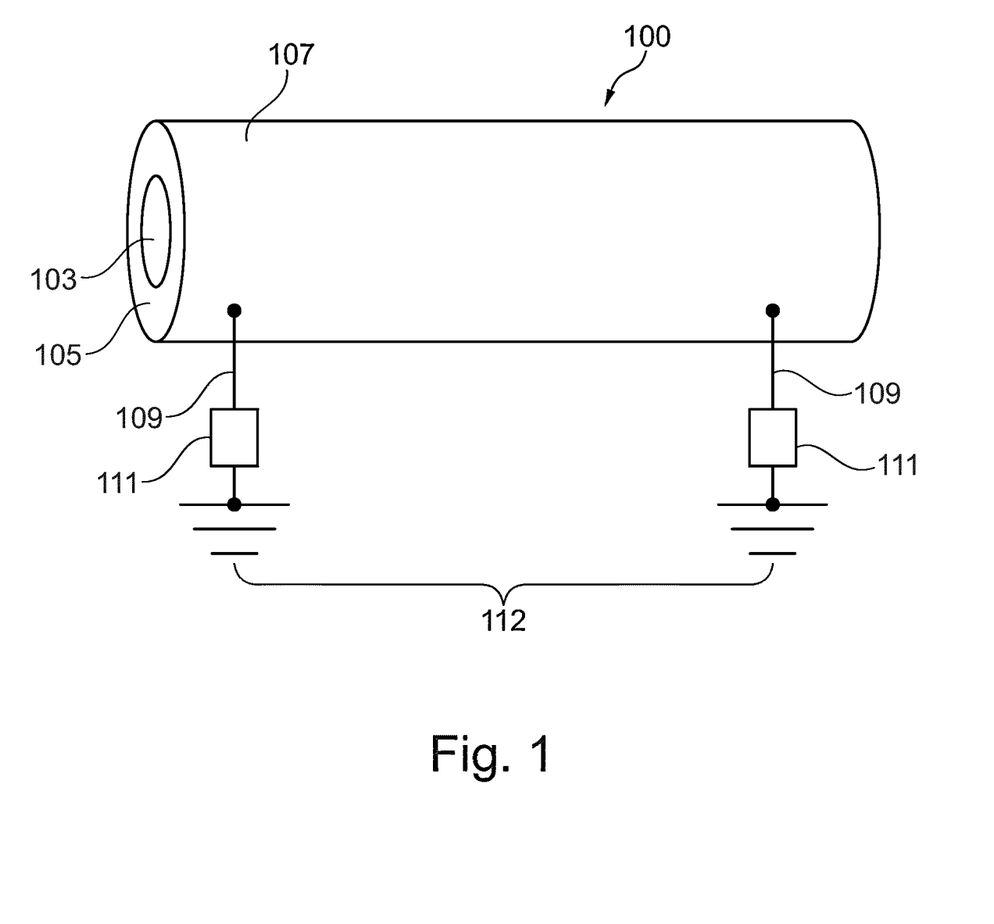
FIG. 1 is a schematic perspective view of a simplified example of an electrical power transmission cable.

FIG. 1 shows a simplified, schematic, partial cross-sectional view of an electrical power transmission cable 100.

Such an electrical power transmission cable 100 typically comprises an electrically conductive central core 103, for example of copper, and configured to transmit an electrical current, in particular a direct current.

The central core 103 is surrounded by an electrically insulating jacket 105, for example, of cross-linked polyethylene.

Around the insulating jacket is a metal shield 107.

Of course, further layers or fibres not shown may be arranged around the metal shield 107, e.g. with mechanical functions (e.g. reinforcements) or with service functions (e.g. optical fibres for transmitting service signals or for measurements). In particular, semiconductor layers not shown may furthermore be present between the conductive central core 103 and the electrically insulating jacket 105, and between the electrically insulating jacket 105 and the metal shield.

At predefined intervals and for safety reasons, the metal shield 107 is connected to earth via a grounding connection 109.

In FIG. 1, the grounding connections 109 have been shown schematically as directly connected to the metal shield 107 of a cable 100.

More typically, however, these grounding connections 109 are generally made at more convenient locations. The reason for this is that these electrical transport cables 100 are of a certain length (e.g. one or more hundred to a few km) and in order to cover a greater distance (e.g. a hundred km or more), several sections or lengths of cables 100 must be connected to each other, in particular via junctions. These junctions can have one or more earthing points, but this is not mandatory for each junction.

Thus, these grounding connections of 109 are, for example, arranged at the end of a section or length of electrical power transmission cable 100 at the point where it is to be connected to the next section/length via a junction or when the end of the electrical power transmission cable 100 is connected to, for example, another piece of equipment, such as a converter station.

This grounding connection 109 can be made via a low impedance (a simple electrical grounding connection) or via a variable impedance, for example via a surge arrester.

In the ground connection 109, for example, a sensor 111 for measuring the leakage current, for example, a direct current sensor is arranged.

As will be detailed below, two successive grounding connections 109 will define a measurement segment 112, in particular for measuring the leakage current which depends in particular on the properties at time t of the electrically insulating enclosure 105 and on environmental parameters, in particular the temperature. This is because the properties of the insulating jacket 105 may vary over time, for example due to ageing of the material caused by temperature changes.

Figure 2:
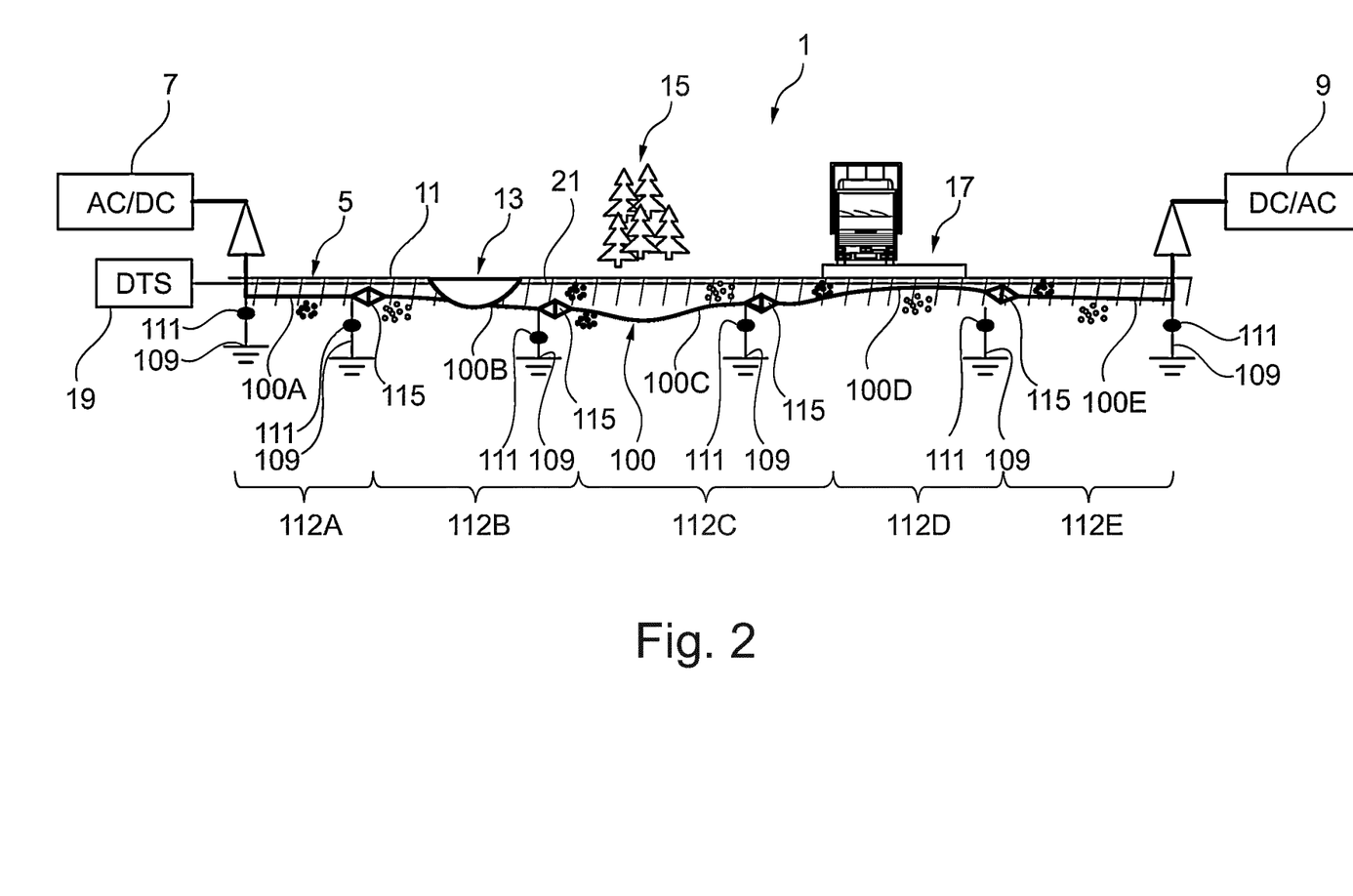
FIG. 2 is a schematic view of an example of an electrical power transmission system.

FIG. 2 shows schematically a DC electrical power transmission system 1. This may be a low, medium or high voltage DC power transmission system 1.

This system 1 comprises in particular the electrical power transmission cable 100 which is, for example, buried in the ground 5 along its course between two converter stations 7 and 9. For example, this is a point-to-point system.

The converter stations 7 and 9 are shown in FIG. 1 as AC/DC (AC to DC) converters for station 7 and DC/AC (DC to AC) converters for station 9.

Alternatively, depending on the requirements, for example, DC/DC stations may also be provided as a voltage step-up or step-down between two electrical power transmission networks or cables 100 not operating at the same voltage. An example is a link between a high voltage DC network and a low voltage DC network.

At one end of the converter stations 7 or 9, an electrical power generation facility (not shown) may be connected, such as a renewable energy generation facility (photovoltaic panels, hydroelectric plant, wind turbines etc.).

At the other end of the converter stations 7 or 9, for example, a conventional AC power distribution network is connected to deliver the electrical power to the end consumers.

Of course, FIG. 1 shows only a simplified example and the electrical energy transport system 1 may comprise several electrical energy transport cables 100, which may be connected to each other for example in a network according to a desired network topography (ring, star or a combination of these two topographies, or even a more complex network structure).

In FIG. 2, the electrical power transmission cable 100 is buried, with the ground level 11 represented by a line. During the burial of the electrical power transmission cable 100, the course and topology of the terrain is recorded and stored, for example in a database. Thus, the database includes a multitude of geographical positions corresponding to the exact position of the electrical power transmission cable 100, and for each of these geographical positions, its burial depth, the nature of the soil with its characteristics (e.g. thermal resistance and/or specific heat) and other particularities (passage under a road or in a river).

As can be seen schematically in FIG. 2, the depth of burial of the electrical power transmission cable 100 varies along its course. In addition, the cable 100 runs, for example, in a river 13, under a forest 15 or under a road 17.

Consequently, even if it is assumed, for example, that the ambient air temperature is constant throughout the course of the cable 100, the same is not true of the temperature around the electrical power transmission cable 100, which may be lower than the ambient air temperature, for example, when passing through a river, when the burial depth is greater or when passing through a sheltered area, for example, in a forest. This temperature of the power cable 100 may be higher, for example, when passing under an asphalt road 17 exposed to the sun.

For some networks, the cable 100 runs, for example, along existing road or rail infrastructures that connect built-up areas and may be subject to significant heating in sunny weather.

The electrical transport cable 100 can, for example, be formed by several sections or lengths of cable 100 connected to each other.

In FIG. 2, as an example, five sections or lengths of cable 100A-E are shown.

These sections 100A-E are connected by junctions 115 which, here, are junctions with grounding connections 109 having leakage current sensors 111. Of course, additional junctions can be provided in each of the sections 100A-E, for example without a ground connection.

Thus, between two successive grounding connections 109, a measurement segment 112 can be defined, in this case, five measurement segments 112A-E.

In addition, the system 1 is equipped with a Distributed Temperature Sensing System (DTS) 19. This is, for example, one of the systems described in the article "Distributed Temperature Sensing: Review of Technology and Applications" IEEE Sensors Journal (Volume: 12, Issue: 5, May 2012).

In practice, a DTS 19 comprises one or more optical fibres 21 which can be integrated into the armouring of the electrical power transmission cable 100 and which allow the temperature profile along the cable to be profiled with an accuracy of approximately 1° C. and a spatial resolution of approximately 1 m over the distance.

Alternatively, as shown in FIG. 2, the fibre of the DTS 19 is not integrated into the cable armature 100, but is separate from it. In this case, the optical fibres 21 are arranged in the vicinity of the electrical power transmission cable 100. By choosing a separate installation, it is easier to replace the optical fibres 21 in case of failure.

Alternatively, to determine the temperature profile, temperature sensors may also be arranged along the electrical power transmission cable 100. These can be sensors, including infrared sensors.

Alternatively, the temperature profile can be determined from meteorological data (air temperature, ground temperature), data on the burial of the cable 100 and thermodynamic modelling which calculates the temperature at the cable 100 from the ambient temperature or the ground temperature. In this case, the load (current and voltage) to which the transport cable 100 is subjected and which also contributes to a heating of the insulating jacket 105 and to its ageing, is also taken into account.

Figure 3:
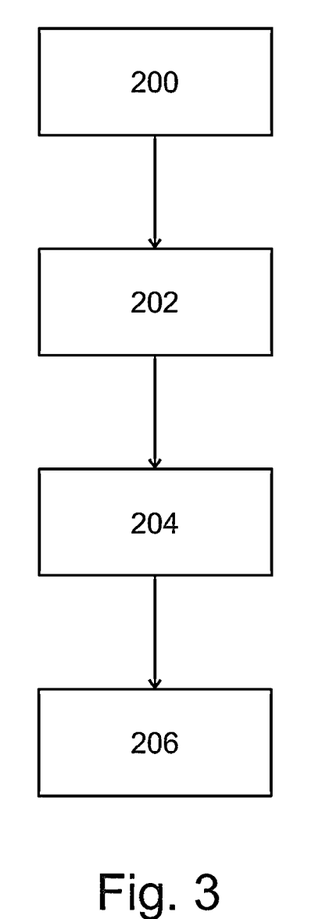
FIG. 3 is an example of a flow chart of the process according to the invention.

FIG. 3 shows schematically, and in a simplified manner, the steps of the process of the invention. Some of the steps may take place in parallel or in a different order than shown in FIG. 3.

According to a step 200, along at least one measurement segment 112, or along all measurement segments 112A-E, at least one profile of a temperature parameter is determined.

As discussed above, the temperature profile can be profiled using a DTS 19 using fibre optic technology integrated into the armouring of the electrical power cable 100. Thus, for example, for all the geographical positions recorded in the database and corresponding to the location of the electrical power transmission cable 100, a temperature value measured in the vicinity of the metal shield 107 of the cable 100 is available.

The leakage current is a manifestation of electrical charges passing through the insulating jacket 105 (the dielectric) of the electrical power transmission cable 100. This leakage current depends, in particular, on the temperature of the central conductive core 103 of the cable 100 due to the Joule effect, of the temperature gradient between the conductive core 103 and the metal shield 107, of the applied voltage and of the possibly time-varying dielectric state of the insulating jacket 105.

The temperature thus measured by the DTS 19 should be approximately that of the metal shield 107.

Knowing in particular the voltage applied to the electrical transport cable 100, the load current and the temperature profile, according to a step 202, a theoretical leakage current I_leak-theo between the grounding connections 109 of the measurement segment 112 is determined by calculation.

This calculation of a theoretical leakage current I_leak-theo can be performed in at least two embodiments.

In a first embodiment, I_leak-theo is calculated based on the applicable physics formulas. It is therefore a fully digital simulation.

In a second embodiment, the calculation of a theoretical leakage current I_leak-theo may be based on feedback, in particular by leakage current measurements over a predetermined period of time, in particular a learning period which may, for example, be as long as one year of operation of the electrical power transmission system 1. The calculation of a theoretical leakage current I-leak-theo between the two earthed junctions can be done by using a database of measurements made in the first year of operation for each segment and by looking for measurements that have been made with similar temperature and load current parameter profiles and applying, for example, correction factors.

Of course, other embodiments, in particular a combination of the first and second embodiments described above, may also be envisaged. For example, it is possible to reduce the training period to one or two months of operation, e.g. in the spring or autumn, or one month in the spring and one month in the autumn, and then to calculate I_leak-theo by numerical extrapolation to take into account, for example, the temperature profiles in the summer or winter.

As per a step 204 (which may also precede step 200 or 202), the leakage current I leak-mes between the ground connections 109 of the measurement segment 112 under consideration is measured.

Then, as per a step 206, an alert is generated if the difference between the amplitude of the theoretical leakage current I_leak-theo and the amplitude of the measured leakage current I_leak-mes exceeds a predetermined threshold, for example if this difference is greater than 5-20% I_leak-mes.

It will be described in detail below how step 202 of the process in FIG. 3 can be further optimised.

Figure 4:
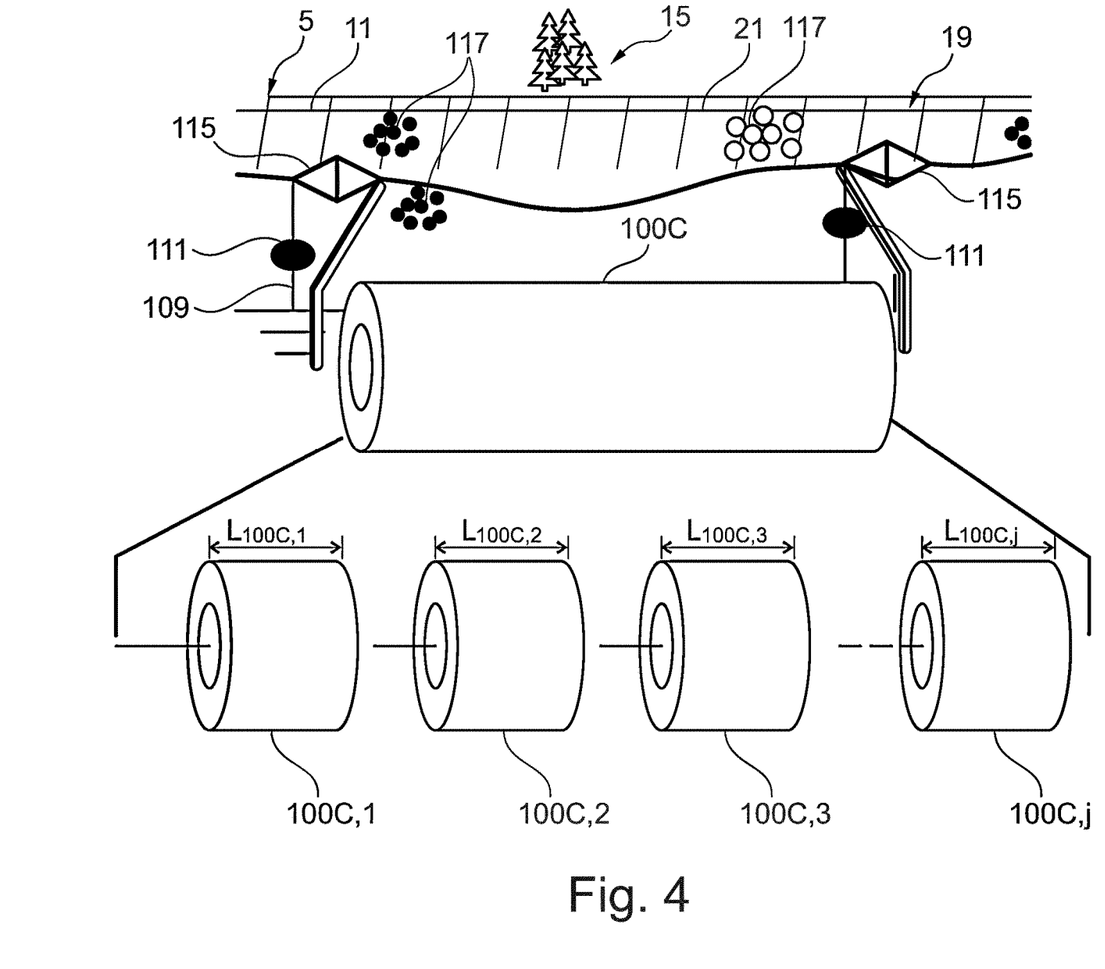
FIG. 4 shows a schematic view of a measurement segment.

For this purpose, consider FIG. 4 showing the measurement segment 112C as an example.

Each measurement segment 112 (here 112C) can be subdivided into j sections (j being a natural number) and it can be shown that the leakage current Ileak 112C is the sum of the leakage currents of the j sections. More generally $$I_{leak_i}(t) = \Sigma_{n=1}^{j} I_{leak\_i,j}(t)$$

where i is the reference of the measurement segment, here 112C, and j is the number of sections subdividing the measurement segment i.

To optimise the process of FIG. 3, the subdivision into j sections will be done by classifying the sections by several temperature ranges of the power transmission cable, one temperature range having a span of less than or equal to 5° C., more specifically less than or equal to 2° C. and in particular less than or equal to 1.5° C.

For example, the measurement segment 112C is divided into j sections, each section belonging, for example, to one of the temperature ranges of a span of 2° C., in particular the range of T=30° C. to T<32° C., T=32° C. to T<34° C., T=34° C. to T<36° C., T=36° C. to T<38° C., T=38° C. to T<40° C., . . . T=48° C. to T<50° C.

The length of each section Li,j (in this case L100C,1, L100C,2, L100C,3 . . . L 100C,j) can be variable and depends only on the temperature being within one of the predefined ranges.

This classification is intended to facilitate and accelerate the determination of the theoretical leakage current I_leak-theo.

Indeed, as already mentioned above, the leakage current depends, in particular, on the temperature of the central conductive core 103 of the cable 100 due to the Joule effect, of the temperature gradient between the conductive core 103 and the metallic screen 107, of the applied voltage and of the state of the dielectric, which may vary over time, of the insulating jacket 105.

Consequently, knowing the load current I_load and the load voltage V_load applied to the electrical energy transport cable 100, and the temperature-dependent electrical resistance of the central core named R (T_(c, 100C)), the contribution of the central core 103 to the temperature rise can be determined by the Joule effect, and by measuring the temperature, in particular in the vicinity of the metal shield 107, by means of the DTS 19, the leakage current can be calculated, which depends on the temperature gradient as well as on the state of the dielectric of the insulating jacket 105 (in particular, also on its ageing).

At a given time t, the load current I_load and the load voltage V_load applied to the electrical power transmission cable 100 may be considered constant along the measurement segment 112C.

Only the temperature measured in particular in the vicinity of the metal shield 107 by the DTS 19 varies, in particular, according to the environment of the cable as described above.

Indeed, the depth to which the transport cable 100 and the junctions 115 are buried is not constant and the environment of the transport cable 100 and the junctions 115 varies along the course of the cable 100. The variation in burial and also in the backfill 117 surrounding the cable induces a varying thermal environment for the cable 100 and the junctions 115.

By dividing the measurement segment i into sections belonging to the same temperature range, the leakage currents of the sections j belonging to the same temperature range or class can be calculated in almost a single calculation operation, thus significantly accelerating the determination of the leakage current of the measurement segment in question. The step of calculating a partial theoretical leakage current per section is carried out in particular in a single operation for sections of the same class after the classification.

Theoretical partial leakage currents per section j can thus be calculated, and theoretical partial leakage currents can then be added together to obtain the theoretical leakage current of a measurement segment i.

When calculating a theoretical leakage current in a measurement segment, at least one environmental parameter from the following group is taken into account, for example:
  the burial-depth profile of the electrical transmission cable,
  the thermal-resistance profile of the soil surrounding the electrical transmission cable,
  the specific-heat profile of the soil surrounding the electrical transmission cable.
  an ageing model, in particular of the thermal and/or electrical properties of the insulating jacket of the power transmission cable.

These environmental parameters can also be used to further refine the classifying sections j, i.e. sections j of the same class are not only in the same temperature range, but also in particular in the same burial depth range.

In case a temperature measuring system 19 DTS is not available, but only for example meteorological data (air temperature, ground temperature, sunshine etc.), the temperature in the vicinity of the cable 100 can be modelled taking into account burial data which can be stored for example in a database.

Figure 5:
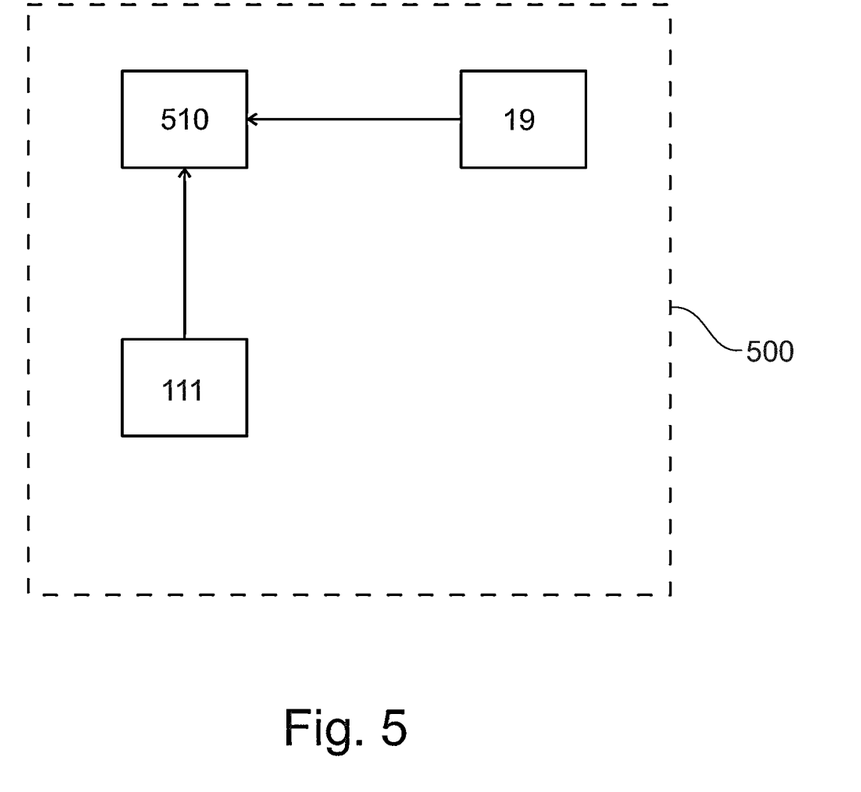
FIG. 5 shows schematically an example of a device according to the invention.

The method clearly shown in FIG. 3, may be carried out by an electrical power transmission system monitoring device 500 for a direct current electrical power transmission network 1 as shown in FIG. 5.

This device 500 comprises one or more functional units configured to perform one or more of the steps of the process of FIG. 3.

According to an example embodiment, the device 500 comprises a temperature measurement system DTS 19 in order to determine, along a measurement segment, at least one profile of a temperature parameter. Other systems such as infrared temperature sensors can be considered The device 500 further comprises sensors 111 for measuring the leakage current, for example a direct current measuring sensor arranged in grounding connections 109.

Finally, the device 500 comprises for example a calculation and processing unit 510, for example a computer equipped with a processor, random access memories and read-only memories and loaded with a specific computer program to determine by calculation a theoretical leakage current between the grounding connections of a measurement segment taking into account the temperature parameter profiles and the load current and voltage, and to generate an alert if the difference between the theoretical leakage current and the measured leakage current exceeds a predetermined threshold.

The calculation and processing unit 510 is, for example, also configured to:
  perform a classification by several temperature ranges of the power transmission cable of a measuring segment into sections, a temperature range having a span of less than or equal to 5° C., in particular less than or equal to 2° C., and more specifically less than or equal to 1.5° C.,
  calculate theoretical partial leakage currents per section,
  add the partial theoretical leakage currents to obtain the theoretical leakage current of a measurement segment.

The temperature parameter can be the external temperature of the transport cable 100 or the ambient temperature on the ground along the power transport cable of a measurement segment. In the latter case, the heat transfers are modelled back to the temperature of the transport cable at the metal shield 107.

The calculation and processing unit 510 is for example also configured to take into account at least one environmental parameter from the following group when calculating a theoretical leakage current in a measurement segment:
  the burial-depth profile of the electrical transmission cable,
  the thermal-resistance profile of the soil surrounding the electrical transmission cable,
  the specific-heat profile of the soil surrounding the electrical transmission cable,
  of an ageing model, in particular of the thermal and/or electrical properties of the insulating jacket of the power transmission cable when calculating a theoretical leakage current in a measuring segment.

Lastly, the calculation and processing unit 510 can store and then take into account the history of certain parameters during operation (history of the rated current during operation or of the temperature of the electrical transmission cable) in order to use them to determine, even more finely, differences between the theoretical leakage current (I_leak-theo) and the measured leakage current (I_leak-mes).

It is thus understood that the monitoring method and device according to the invention allow preventive maintenance interventions before the appearance of a defect on the insulating enclosure 107 that could cause a short circuit.

The invention claimed is:

1. A method for monitoring an electrical power transmission system for a DC electrical power transmission network with an electrical power transmission cable comprising:
  determining, along a measurement segment, at least one profile of a temperature parameter,
  determining a theoretical leakage current (I_leak-theo) between the ground connections of the measurement segment taking into account the temperature parameter profiles and a load current and voltage,
  measuring a leakage current (I leak-mes) between the ground connections of the measuring measurement segment, and
  generating an alert if a difference between the theoretical leakage current (I_leak-theo) and the measured leakage current (I_leak-mes) exceeds a predetermined threshold;
  wherein the electrical power transmission cable comprises
    an electrically conductive central core configured to transmit an electrical current,
    an insulating jacket electrically disposed around the central core,
    a metal shield arranged around the insulating jacket, and
    the ground connections of the metal shield, the measurement segment being defined between two successive grounding connections.

2. The monitoring method according to claim 1, wherein at least some temperature parameter profiles are determined by measurements with a fibre-optic system.

3. The monitoring method according to claim 1, wherein at least one temperature parameter profile, is determined by temperature sensors arranged along the measurement segment and/or by means of meteorological data along the measurement segment.

4. The monitoring method according to claim 1, wherein calculating the theoretical leakage current (I_leak_theo) comprises:
classifying the measurement segment into sections by a plurality of temperature ranges of the electrical power transmission cable, wherein a temperature range has a span of less than or equal to 10° C.,
calculating theoretical partial leakage currents per section, and
adding the theoretical partial leakage currents to obtain the theoretical leakage current (I_leak_theo) of the measurement segment.

5. The monitoring method according to claim 4, wherein the span of the temperature range within a single section is less than 2° C.

6. The monitoring method according to claim 4, wherein the calculation of the theoretical partial leakage currents per sections is performed at once for sections of the same class after the classification.

7. The monitoring method according to claim 1, wherein the temperature parameter is an external temperature of the electrical power transmission cable or a temperature measured in a vicinity of the electrical power transmission cable or an ambient ground temperature along the electrical power transmission cable of the measurement segment.

8. The monitoring process according to claim 1, wherein at least one environmental parameter from the following group is taken into account when calculating the theoretical leakage current (I_leak-theo) in the measurement segment:
a burial-depth profile of the electrical power transmission cable,
a thermal-resistance profile of the soil surrounding the electrical power transmission cable, and
a specific-heat profile of the soil surrounding the electrical power transmission cable.

9. The monitoring method according to claim 1, wherein, when calculating the theoretical leakage current (I_leak-theo) of the measurement segment, an ageing model is taken into account.

10. A device for monitoring an electrical power transmission system for a DC electrical power transmission network comprising:
an electrical power transmission cable comprising:
an electrically conductive central core configured to transmit an electrical current,
an insulating jacket electrically disposed around the central core,
a metal shield arranged around the insulating jacket, and
ground connections of the metal shield, with a measurement segment being defined between two successive ground connections, and
one or more functional units configured to:
determine, along the measurement segment, at least one profile of a temperature parameter,
determine a theoretical leakage current (I_leak-theo) between the ground connections of the measurement segment taking into account the temperature parameter profiles and a load current and voltage,
measure a leakage current (I leak-mes) between the ground connections of the measurement segment,
generate an alert if a difference between the theoretical leakage current (I_leak-theo) and the measured leakage current (I_leak-mes) exceeds a predetermined threshold.

11. The monitoring device according to claim 10, wherein at least one functional unit is configured to determine at least one temperature parameter profile by measurements through a fibre optic system.

12. The monitoring device according to claim 10, wherein at least one functional unit is configured to determine at least one temperature parameter profile, by temperature sensor measurements and/or weather data.

13. The monitoring device according to claim 10, wherein at least one functional unit is configured to:
perform a classification by several temperature ranges of the electrical power transmission cable of the measurement segment into sections, a temperature range having a span of 5° C. or less,
determine theoretical partial leakage currents per section, and
add the theoretical partial leakage currents to obtain the theoretical leakage current (I-leak-theo) of the measurement segment.

14. The monitoring device according to claim 13, wherein the span of the temperature range within a single section is less than 2° C.

15. The monitoring device according to claim 10, wherein the temperature parameter is an external temperature of the electrical power transmission cable or an ambient ground temperature along the electrical power transmission cable of the measurement segment.

16. The monitoring device according to claim 10, wherein at least one functional unit is configured to take into account at least one environmental parameter taken from the following group when calculating the theoretical leakage current (I_leak-theo) in the measurement segment:
a burial-depth profile of the electrical power transmission cable,
a thermal-resistance profile of the soil surrounding the electrical power transmission cable, and
a specific-heat profile of the soil surrounding the electrical power transmission cable.

17. The monitoring device according to claim 10, wherein at least one functional unit is configured to take into account an ageing pattern when calculating the theoretical leakage current (I_leak_theo) in the measurement segment.

* * * * *